United States Patent [19]
Takechi et al.

[11] Patent Number: 5,443,690
[45] Date of Patent: Aug. 22, 1995

[54] PATTERN FORMATION MATERIAL AND PATTERN FORMATION METHOD

[75] Inventors: Satoshi Takechi; Makoto Takahashi; Yuko Kaimoto, all of Kawasaki, Japan

[73] Assignee: Fujitsu Limited, Kawasaki, Japan

[21] Appl. No.: 206,177

[22] Filed: Mar. 7, 1994

[30] Foreign Application Priority Data

May 12, 1993 [JP] Japan ................................. 5-110471

[51] Int. Cl.⁶ ........................... B44C 1/22; B29C 37/00
[52] U.S. Cl. ..................................... 430/286; 216/55; 216/48; 216/62
[58] Field of Search .................. 156/655, 659.1, 661.1, 156/668, 904, 643; 430/270, 281, 285, 286

[56] References Cited

U.S. PATENT DOCUMENTS 4,935,094  6/1990  Mixon et al. ................... 156/904 X
5,294,297  3/1994  Nishiura et al. ............... 156/904 X Primary Examiner—William Powell
Attorney, Agent, or Firm—Staas & Halsey

[57] ABSTRACT

A pattern formation material capable of keeping dimensional accuracy of a pattern at a desired level even after a polymer is left standing for a long time after exposure and before baking, and a method of forming such a pattern formation material, which comprises a copolymer containing units containing a polycyclic aromatic ring, a condensed ring having at least one aromatic ring, or an aromatic ring having, as a substitution group, an alicyclic group, a branched alkyl or a halogen, and units from a monomer containing a photosensitive group, and a compound generating an acid by irradiation to ultraviolet rays.

5 Claims, No Drawings

PATTERN FORMATION MATERIAL AND PATTERN FORMATION METHOD

BACKGROUND OF THE INVENTION

1. Field of the Invention

This invention relates to a material for forming a very fine pattern used for fabricating semiconductor devices, and a method of producing such a material.

2. Description of the Related Art

With the appearance emergence of higher integration and miniaturization in electronic devices in recent years, a fine etching technique for use at sizes in the order of below half a micron has been required. In the field of photolithography, a shift has already occurred to using a short wavelength exposure light source so as to satisfy this requirement, and a resist material adaptable to such novel lithographic technique has been required.

Conventional photoresists to cope with UV (ultraviolet light) exposure primarily use a novolak resin as the base, but since absorption in the far UV region, is high, pattern accuracy capable of coping with miniaturization cannot be obtained. To solve this problem, a chemical amplification type resist, which needs a smaller amount of a photosensitive agent, has been developed. Such a resist predominantly uses polyvinylphenol as a base.

In such a chemical amplification resist according to the prior art, however, an acid generated by exposure is neutralized by an amine, etc., contained in the environmental atmosphere and catalytic activity is lost. Further, diffusion of the acid occurs in the resist layer, and it becomes difficult to obtain a desired pattern. This means that the chemical amplification resist according to the prior art cannot be easily applied to a mass-production process.

If a coating film is applied to the resist surface to protect the resist layer from external air, inactivation of the acid due to contact with external air can be prevented. However, this method cannot prevent diffusion of the acid inside the resist layer, so that dimensional accuracy of a pattern cannot be retained.

SUMMARY OF THE INVENTION

It is therefore an object of the present invention to provide a resist material which solves the problems with the prior art described above, and which can retain the dimensional accuracy of the resulting pattern at a desired level even when the resist is left standing for a long time from exposure to baking.

It is another object of the present invention to provide a method of forming a pattern using such a resist material.

To accomplish the objects described above, the present invention provides a pattern formating material comprising a copolymer containing units containing a polycyclic aromatic ring, a condensed ring having at least one aromatic ring, or an aromatic ring having, as a substituent, an alicyclic group, a branched alkyl or a halogen, and the units from a monomer containing a photosensitive group, and a compound generating an acid by irradiation with ultraviolet rays.

According to the present invention, there is also provided a pattern formating material comprising a copolymer containing units of vinylphenol or its derivative, an acrylic or methacrylic acid ester derivative containing, in an ester moiety thereof, an α,α-dimethylbenzyl group, a benzyl group, an α-methylbenzyl group, a 1-cyclopropylethyl group, a 1-methyl-2-propenyl group, a 2-cyclohexenyl group or 1-cyclopropyl-1-methylethyl group, or a vinylbenzoic acid derivative, and units from an acrylic or methacrylic acid ester derivative containing, in an ester moiety thereof, an alicyclic group, and a compound generating an acid by irradiation with ultraviolet rays.

When a pattern is formed using the pattern formation material according to the present invention, a resist containing this pattern formation material is first coated on a substrate and is prebaked to form a resist layer on the substrate. Next, the resist layer on the substrate is selectively exposed to ultraviolet rays, baking is effected and then development is effected to form a resist pattern.

DESCRIPTION OF THE PREFERRED EMBODIMENTS

Examples of monomers containing a photosensitive group useful for the pattern formation material of the present invention include acrylic or methacrylic acid derivatives and vinylbenzoic acid derivatives. Specific examples of such monomers are those compounds which are represented by the following general formulae:

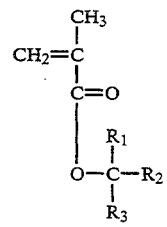

where each of $R_1$, $R_2$ and $R_3$ has the following meaning:

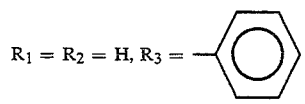

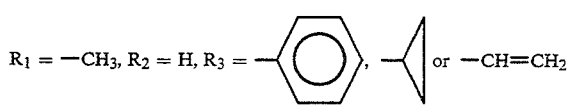

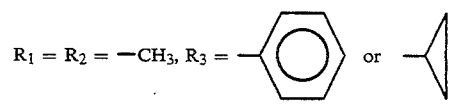

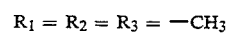

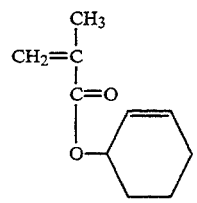

-continued
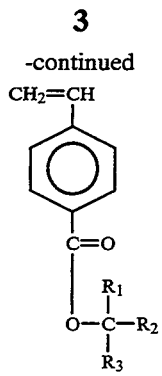
where each of $R_1$, $R_2$ and $R_3$ has the following meaning:
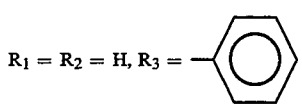
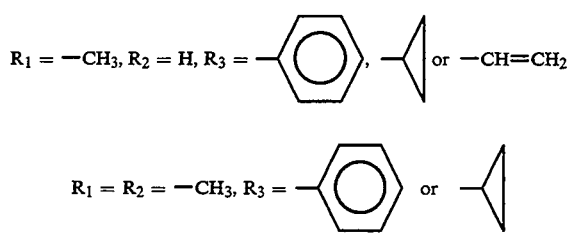
$R_1 = R_2 = R_3 = -CH_3$
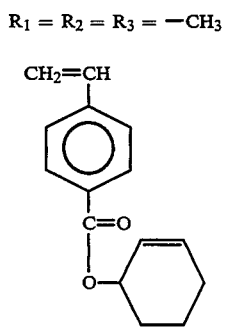
Examples of ethylenically unsaturated monomers containing the aromatic ring or a halogen-substituted aromatic ring are as follows:
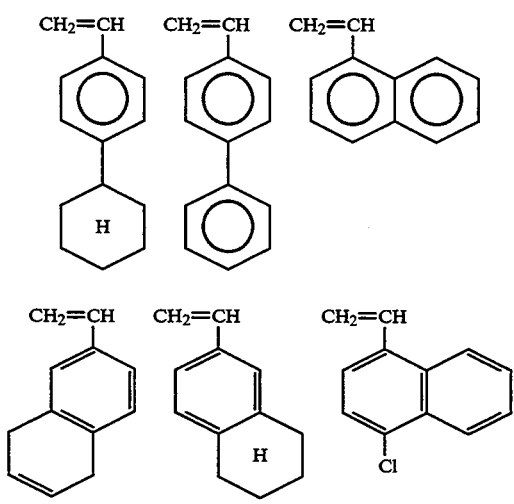
-continued
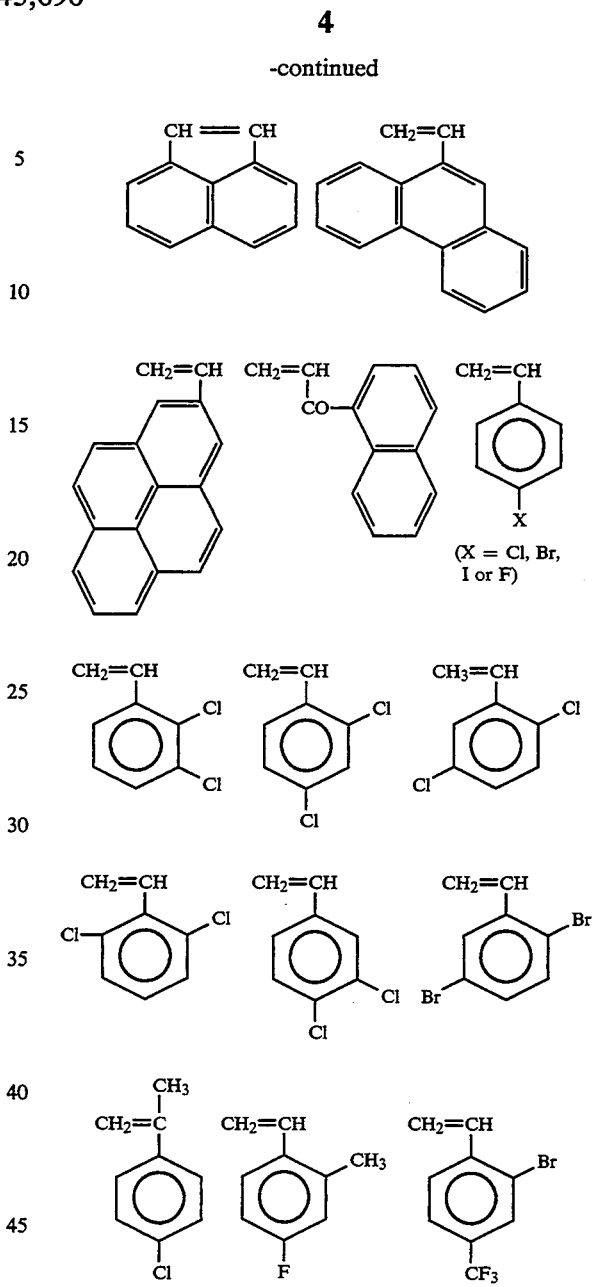
Examples of the vinylphenol derivatives are as follows:

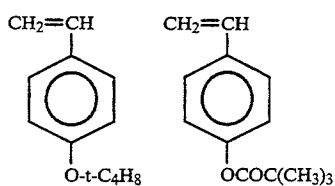
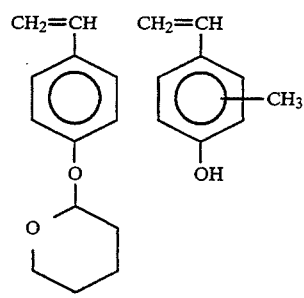
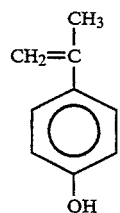

Further, examples of the compounds providing the alicyclic group contained in the ester moiety of the acrylic or methacrylic acid ester derivatives are adamantane, norbornane, cyclohexane, perhydronaphthalene, bicyclohexane, spiro[4,4]nonane, spiro[4,5]decane, tricyclo[5,2,1,0$^{26}$]decane, perhydroanthracene, perhydrofluorene and their derivatives.

Examples of the compounds which are useful for the present invention and generate an acid by irradiation with ultraviolet rays are as follows:

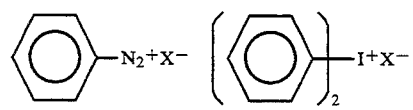
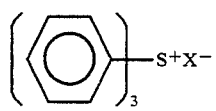

($X^-$ = halogen, $BF_4^-$, $PF_6^-$, $AsF_6^-$, $SbF_6^-$ or $CF_3SO_3^-$)

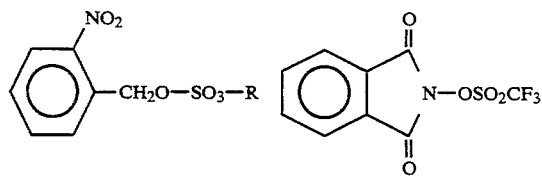

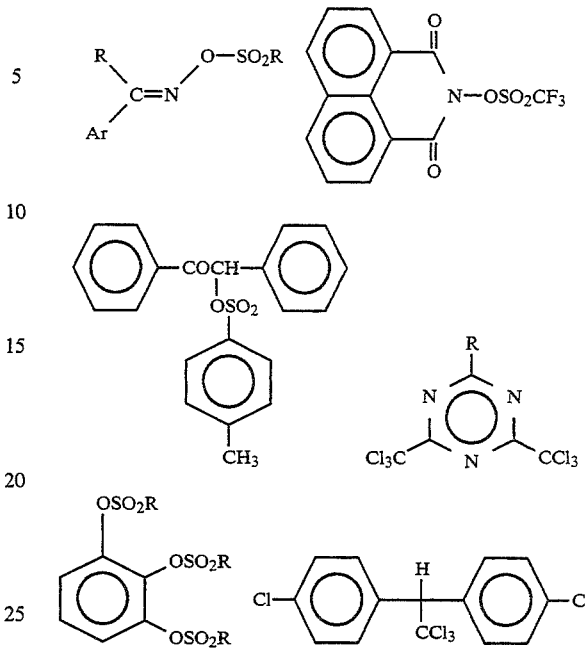

In the above formulae, each R represents a substituted or unsubstituted aromatic hydrocarbon or alkyl group.

The present invention will further be explained below by way of examples.

Synthesis Example 1

Synthesis of tert-butyl methacrylate (tert-BuMA)—ehtyl methacrylate (EMA) copolymer 9.94 g (0.07 mol) of tert-butyl methacrylate, 3.42 g (0.03 mol) of ethyl methacrylate and 0.8212 g (5 mol %) of AIBN were charged into 50 g (1.7 M) of toluene. After the mixture was stirred at 80° C. for 6 hours, hydroquinone was added and the reaction was stopped. Toluene was evaporated by an evaporator to prepare a THF solution, and reprecipitation was repeated using water and methanol (3:2). The polymer thus refined was dried in a vacuum oven at 40° C. for 16 hours. There was obtained a polymer having a molecular weight of 8,400, a degree of dispersion of 1.83 and a tert-BuMA:EMA ratio of 81:19.

Synthesis Example 2

Synthesis of tert-butyl methacrylate—cyclohexyl methacrylate (CHMA) copolymer 9.96g (0.07 mol) of tert-butyl methacrylate, 5.01 g (0.03 mol) of cyclohexyl methacrylate and 0.8205 g (5 mol %) of AIBN were charged into 50g (1.7 M) of toluene. After the mixture was stirred at 80° C. for 10 hours, hydroquinone was added and the reaction was stopped. Toluene was evaporated by an evaporator to prepare a THF solution, and reprecipitation was repeated using water and methanol (3:2). The polymer thus refined was dried in a vacuum baking oven at 40° C. for 16 hours. There was obtained a polymer having a molecular weight of 8,600, a degree of dispersibility of 1.86 and a tert-BuMA:CHMA ratio of 92:8.

Synthesis Example 3

Synthesis of tert-butyl methacrylate—p-chloro-stryene (Cl-St) copolymer 7.12 g (0.05 mol) of tert-butyl methacrylate, 6.93 g (0.05 mol) of p-chlorostyrene and 0.8207 g (5 mol %) of AIBN were charged into 50 g (1.7 M) of toluene. After the mixture was stirred at 80° C. for 1 hour, hydroquinone was added and the reaction was stopped. Toluene was evaporated by an evaporator to prepare a THF solution, and reprecipitation was repeated using water and methanol (1:2). The polymer thus refined was dried in a vacuum baking oven at 40° C. for 18 hours. There was obtained a polymer having a molecular weight of 9,600, a degree of dispersion of 1.89 and a tert-BuMA:Cl-St ratio of 38:62.

Synthesis Example 4

Synthesis of tert-methacrylate—2-vinylnaphthalene copolymer 8.53 g (0.06 mol) of tert-butyl methacrylate, 6.17 g (0.04 mol) of 2-vinylnaphthalene and 0.8205 g (5 mol %) of AIBN were charged into 50 g (1.7 M) of toluene. After the mixture was stirred at 80° C. for 10 hours, hydroquinone was added and the reaction was stopped. Toluene was evaporated by an evaporator to prepare a THF solution, and reprecipitation was repeated using water and methanol (2:3). The polymer thus refined was dried in a vacuum baking oven at 40° C. for 14 hours. There was obtained a polymer having a molecular weight of 7,800, a degree of dispersion of 1.84 and a tert-BuMA:vinylnaphthalene ratio of 47:53.

Synthesis Example 5

Synthesis of vinylphenol-tert-butyl methacrylate-2-vinylnaphthalene polymer 5.54 g (0.05 mol) of vinylphenol, 5.47 g (0.04 mol) of tert-butyl methacrylate, 2.37g (0.02 mol) of 2-vinylnaphthalene and 0.8205 g (5 mol %) of AIBN were charged into 50g (1.7 M) of toluene. After the mixture was stirred at 80° C. for 11 hours, hydroquinone was added and the polymerization was stopped. Toluene was evaporated by an evaporator to prepare a THF solution, and reprecipitation was repeated using cyclohexane. The polymer thus refined was dried in a vacuum baking oven at 40° C. for 14 hours. There was obtained a polymer having a molecular weight of 12,000, a degree of dispersion of 1.87 and a vinylphenol:tert-BuMA:vinylnaphthalene ratio of 52:43:18.

Comparative Example 1

A methyl cellosolve acetate (MCA) solution (15 wt %) of poly(tert-butyl methacrylate) and triphenylsulfonium hexafluoroantimonate (10 wt % on the basis of the polymer) was prepared as a resist. This solution was coated onto a silicon (Si) wafer and was then baked at 60° C. for 20 minutes to form a film having a film thickness of 1.0 μm. After exposure was effected by ultraviolet rays emitted by a KrF excimer stepper (NA 0.45), baking was carried out at 80° C. for 60 seconds and development was thereafter carried out for 1 minute using an alkali developing solution. Though a pattern of 0.5 μm could be formed, a pattern upper layer portion swelled in the resulting pattern. When the product was left for standing after exposure and was then baked, there was obtained a pattern in which the surfaces of lines and spaces continued into one another.

Comparative Example 2

A cyclohexanone solution (15 wt %) of the polymer of the tert-butyl methacrylate-ethyl methacrylate copolymer (tert-BuMA:EMA=81:19) obtained in Synthesis Example 1 and triphenylsulfonium hexafluoroantimonate (15 wt % on the basis of the polymer) was prepared as a resist. The solution was coated onto the Si wafer and was then baked at 60° C. for 20 minutes to form a film having a film thickness of 0.65 μm. After exposure was effected by ultraviolet rays emitted by a KrF excimer stepper (NA 0.45), baking was carried out at 80° C. for 60 seconds and development was thereafter carried out for 1 minute using an alkali developing solution. Though "T-top" portions were sometimes observed in the pattern immediately after exposure, a vertically erect pattern could be formed. However, when baking was carried out after the wafer was left standing for 30 minutes after exposure, the line width became small (the space became great) in the resulting pattern.

Example 1

A cyclohexanone solution (15 wt %) of tert-butyl methacrylate-cyclohexylmethacrylate copolymer (tert-BuMA:CHMA=92:8) obtained in Synthesis Example 2 and triphenylsulfonium hexafluoroantimonate (15 wt % on the basis of the polymer) was prepared. The solution was coated onto a Si wafer and was then baked at 60° C. for 20 minutes to form a film having a film thickness of 0.65 μm. After exposure was effected by ultraviolet rays emitted by a KrF excimer stepper (NA 0.45), baking was carried out at 80° C. for 60 seconds and development was thereafter carried out for 1 minute using an alkali developing solution. The pattern immediately after exposure was vertically erect. Even after the wafer was left standing for 30 minutes after exposure and was then baked, the line width did not change. Furthermore, even when the wafer was left standing for one hour after exposure, a change in the line width was not observed.

Example 2

A cyclohexanone solution (15 wt %) of tert-butyl methacrylate-p-chlorostyrene copolymer (tert-BuMA:Cl-St=38:62) of Synthesis Example 3 and triphenylsulfonium hexafluoroantimonate (15 wt % on the basis of the polymer) was prepared. The solution was coated onto an Si wafer and was then baked at 60° C. for 20 minutes to form a film having a film thickness of 0.65 μm. After exposure was effected by ultraviolet rays emitted by a KrF excimer stepper (NA 0.45), baking was carried out at 80° C. for 60 seconds and development was thereafter carried out for one minute using an alkali solution. The pattern immediately after exposure was vertically erect. Even after the wafer was left standing for 30 minutes and was then baked, the line width did not change. Furthermore, when the wafer was left standing for one hour after exposure, a change in the line width was not observed.

Example 3

A cyclohexanone solution (15 wt %) of tert-butyl methacrylate-2-vinylnaphthalene copolymer (tert-BuMA:vinylnaphthalene =47:53) of Synthesis Example 4 and triphenylsulfonium hexafluoroantimonate (15 wt % on the basis of the polymer) was prepared. The solution was coated onto an Si wafer and was then baked at 60° C. for 20 minutes to form a film having a film thickness of 0.65 μm. After exposure was effected by ultraviolet rays emitted by using a KrF excimer stepper (NA 0.45), baking was carried out at 80° C. for 60 seconds and development was thereafter carried out for one minute using an alkali developing solution. The pattern immediately after exposure was vertically erect. Even after the wafer was left standing for 30 minutes after exposure and was then baked, the line width did not change. Furthermore, when the wafer was left standing for one hour after exposure, a change in the line width was not observed.

Example 4

A cyclohexanone solution (15 wt %) of vinylphenol-tert-butyl methacrylate-2-vinylnaphthalene copolymer (vinylphenol:tert-BuMA:vinylnaphthalene=52:43:18) of Synthesis Example 5 and triphenylsulfonium hexafluoroantimonate (15 wt % on the basis of the polymer) was prepared. The solution was coated on an Si wafer and was then baked at 60° C. for 20 minutes to form a film having a film thickness of 0.65 μm. After exposure was effected by ultraviolet rays emitted by a KrF excimer stepper (NA 0.45), baking was carried out at 80° C. for 60 seconds, and development was thereafter carried out for one minute using an alkali developing solution. The pattern profile of a sample baked immediately after exposure was excellent. Even after the wafer was left standing for 30 minutes after exposure and was then baked, the line width did not change. Furthermore, when the wafer was left standing for one hour, a change in the pattern was not observed.

Example 5

A cyclohexanone solution was prepared by adding triphenylsulfonium antimonate represented by the following formula

as a photo acid generating agent to a vinylphenol-adamantyl methacrylate-tert-butyl methacrylate terpolymer represented by the following formula:

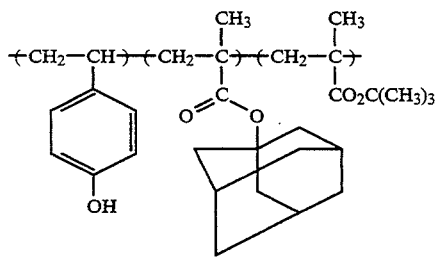

The composition of the polymer hereby used was 53:13:34 and its molecular weight was 9,200.

The resist solution thus prepared was coated onto a substrate by spin coating and was baked at 60° C. for 100 seconds to obtain a thin film having a film thickness of 0.7 μm. After exposure was effected by ultraviolet rays emitted by an excimer stepper (NA 0.45), and was immediately carried out at 100° C. for 60 seconds. Thereafter, development was done using an alkali solution (tetramethylammonium hydroxide 2.38% aqueous solution) for 60 seconds, and rinsing was effected using pure water. The surface pattern fell off at 4 mJ/cm² and 0.5 μm lines and spaces were resolved at 7 mJ/cm². When the section of the resulting pattern was observed, the pattern hardly had any "T-top" resulting from an insoluble surface layer. A similar pattern could be obtained when baking was carried out after the wafer was left standing for 30 minutes after exposure.

Comparative Example 3

A cyclohexanone solution was prepared by adding 15 wt % of triphenylsulfonium antimonate as an acid generating agent to a vinylphenol-t-butyl methacrylate copolymer represented by the following formula:

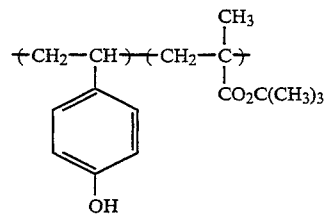

The polymer had a composition ratio of 41:59 and a molecular weight of 16,900. When the resulting pattern was evaluated in the same way as in Example 1, the surface pattern fell off at 3 mJ/cm², and 0.85 μm lines and spaces were resolved at 3 mJ/cm². The "T-top" shapes were remarkably observed in the sectional shape and the line pattern became small. When baking was carried out after the polymer was left standing for 30 minutes after exposure, a pattern in which the surfaces of the lines and spaces continued into one another was obtained.

Example 6

The experiment was carried out in the same way as in Example 5 except that a polymer having a composition ratio of 42:22:36 and a molecular weight of 24,000 was used in place of the polymer of Example 5. As a result, a pattern of 0.7 μm lines and spaces devoid of the eave-like portions could be obtained at 25 mJ/cm². A similar pattern could also be obtained when baking was carried out after the polymer was left standing for 30 minutes after exposure.

Example 7

After the polymer was left standing for 5 minutes under the condition of Example 5, baking and development after exposure were carried out. As a result, the surface pattern fell off at 10 mJ/cm² and a pattern of 0.7 μm lines and spaces could be obtained at 15 mJ/cm². A similar pattern could be obtained when baking was carried out after the polymer was left standing for 30 minutes after exposure.

Comparative Example 4

After the polymer was left standing for 5 minutes after exposure in Comparative Example 3, baking and development after exposure were carried out. As a result, a pattern could not be obtained due to a surface insoluble layer. When baking was carried out after the polymer was left standing for 30 minutes after exposure, a pattern in which the lines and spaces continued into one another could be obtained.

Example 8

A cyclohexanone solution was prepared by adding 5 wt % of triphenylsulfonium antimonate as an acid generating agent to a vinylphenol-adamantyl methacrylate-t-butyl p-vinylbenzoate terpolymer represented by the following formula:

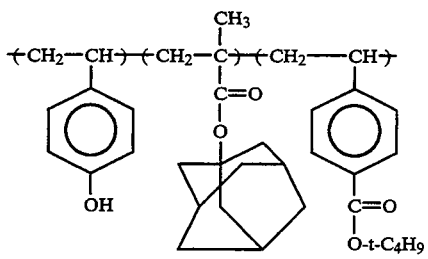

The polymer used hereby had a composition ratio of 45:15:40 and a molecular weight of 6,500.

The resist solution thus prepared was coated to a substrate by spin coating, and baking was carried out at 60° C. for 100 seconds to obtain a film having a film thickness of 0.7 μm.

Further, exposure was effected by ultraviolet rays emitted by an excimer stepper (NA 0.45) and baking was carried out immediately after exposure at 100° C. for 60 seconds. Thereafter, development was carried out for 60 seconds using an alkali developing solution (2.38% aqueous solution of tetramethylammonium hydroxide), and rinsing was then done using pure water.

The surface pattern fell off at about 5 mJ/cm² and 0.5 μm lines and spaces were resolved at 8 mJ/cm². The resulting pattern was devoid of "eaves" and was excellent.

A similar result could be obtained by carrying out baking after the sample was left standing for 30 minutes after exposure.

Comparative Example 5

A resist solution was prepared by adding 5 wt % of TPSSbF$_6$ as an acid generating agent to a vinylphenol-t-butyl p-vinylbenzoate copolymer (having a composition ratio of 40:60 and a molecular weight of 8,000) represented by the following formula:

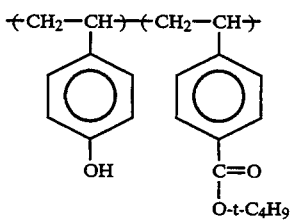

Patterning was carried out in the same way as in Example 9. Though the pattern fell off below 10 mJ/cm², it had a profile having large "T-top".

When baking was carried out after the sample was left standing for 30 minutes after exposure, the upper portions of the pattern continued into one another.

Example 9

Adamantyl methacrylate and α,α-dimethylbenzyl methacrylate were charged in equimolar amounts, and radical polymerization was carried out at 80° C. using toluene as a reaction solvent, and azoisobutylonitrile (AIBN) as a polymerization initiator. Precipitation was repeated by adding the reaction solution dropwise into methanol and refining was thus effected. The resulting polymer had a molecular weight of 4,500, a degree of dispersion of 1.1 and a composition ratio of 60:40. 15 wt % of triphenylsulfonium antimonate was added as an acid generating agent to this polymer to prepare a cyclohexanone solution. The solution was coated by spin coating, and pre-baking was carried out at 60° C. for 100 seconds. The resulting resist film was 0.7 μm thick. Exposure was then effected by ultraviolet rays emitted by a KrF excimer stepper (NA 0.45), and baking after exposure was carried out at 60° C. for 100 seconds. Development was effected using a 2.38% aqueous solution of tetramethylammonium hydroxide (TMAH), and rinsing was made using pure water. As to sensitivity, 1 μm lines and spaces were resolved at 12 mJ/cm², and profile was rectangular, and no deformation was observed. The minimum resolution pattern was 0.35 μm line and space.

Comparative Example 6

When the experiment was carried out using α,α-dimethylbenzyl methacrylate homopolymer in the same way as in Example 9, 1 μm line and spaces were obtained at 3 mJ/cm², but the center portion of the line pattern was recessed and the pattern was deformed.

Comparative Example 7

The experiment was carried out in the same way as in Comparative Example 6, and the baking temperature after exposure was changed to 60° C. However, deformation was still observed in the resulting resist pattern.

Example 10

The experiment was carried out in the same way as in Example 9 except that norbornyl methacrylate was used in place of adamantyl methacrylate, and 1 μm lines and spaces were resolved at 10 mJ/cm² and no deformation was observed in the profile.

Example 11

The experiment was carried out in the same way as in Example 9 except that 4-t-butylcyclohexyl methacrylate was used in place of adamantyl methacrylate, and 0.5 μm lines and spaces were resolved at 16 mJ/cm² and no deformation of the pattern was observed.

As described above, the present invention can provide a chemical amplification resist which is excellent in heat resistance and does not generate pattern deformation, and can form a stable delicate pattern.

We claim:

1. A pattern formation material comprising:
   a copolymer containing units selected from a polycyclic aromatic ring, a condensed ring having at least one aromatic ring, or an aromatic ring having, as a substituent, an alicyclic group, a branched alkyl or a halogen, and units from a monomer containing a photosensitive group; and
   a compound generating an acid by irradiation with ultraviolet rays.

2. A pattern formation material according to claim 1, wherein said monomer containing the photosensitive group is an acrylic or methacrylic acid derivative or a vinylbenzoic acid derivative.

3. A pattern formation method comprising:
   providing a pattern formation material comprising:
      a copolymer containing units selected from a polycyclic aromatic ring, a condensed ring having at least one aromatic ring, or an aromatic ring having, as a substituent, an alicyclic group, a branched alkyl or a halogen, and units from a monomer containing a photosensitive group, and
      a compound generating an acid by irradiation with ultraviolet rays;
   coating a resist containing said pattern formation material on a substrate;
   prebaking said resist to form a resist layer on said substrate;

selectively exposing said resist layer on said substrate to ultraviolet rays;
developing said resist layer after baking; and
forming a resist pattern.

4. A pattern formation material comprising:
a copolymer containing units from vinylphenol or its derivative, an acrylic or methacrylic acid ester derivative containing, in an ester moiety thereof, an α, α-dimethylbenzyl group, a benzyl group, α-methylbenzyl group, a 1-cyclopropylethyl group, a 1-methyl-2-propenyl group, a 2-cyclohexenyl group or a 1-cyclopropyl-1-methylethyl group, or a vinyl-benzoic acid derivative, and units from an acrylic or methacrylic acid ester derivative containing, in an ester moiety thereof, an aliphatic cyclic group; and
a compound generating an acid by irradiation with ultraviolet rays.

5. A pattern formation method comprising:
providing a pattern formation material comprising:
a copolymer containing units from vinylphenol or its derivative, an acrylic or methacrylic acid ester derivative containing, in an ester moiety thereof, an α, α-dimethylbenzyl group, a benzyl group, α-methylbenzyl group, a 1-cyclopropylethyl group, a 1-methyl-2-propenyl group, a 2-cyclohexenyl group or a 1-cyclopropyl-1-methylenthyl group, or a vinyl-benzoic acid derivative, and units from an acrylic or methacrylic acid ester derivative containing, in an ester moiety thereof, an aliphatic cyclic group, and
a compound generating an acid by irradiation with ultraviolet rays;
coating a resist containing said pattern formation material on a substrate;
prebaking said resist to form a resist layer on said substrate;
selectively exposing said resist layer on said substrate to ultraviolet rays;
developing said resist layer after baking; and
forming a resist pattern.

* * * * *

UNITED STATES PATENT AND TRADEMARK OFFICE
CERTIFICATE OF CORRECTION

PATENT NO. : 5,443,690
DATED : Aug. 22, 1995
INVENTOR(S) : TAKECHI et al.

It is certified that error appears in the above-indentified patent and that said Letters Patent is hereby corrected as shown below:

Col. 1, line 11, delete "appearance";
line 22, change "region, is" to --region is--.

Col. 6, line 35, change "ehtyl" to --ethyl--.

Col. 8, line 56, delete "using".

Signed and Sealed this

Twenty-sixth Day of December, 1995

Attest:

BRUCE LEHMAN

Attesting Officer *Commissioner of Patents and Trademarks*